(12) United States Patent
Brunner et al.

(10) Patent No.: US 12,304,009 B2
(45) Date of Patent: May 20, 2025

(54) METHODS OF INSTALLING WIRE BONDING TOOLS ON WIRE BONDING SYSTEMS, AND RELATED INSTALLATION TOOLS AND SYSTEMS

(71) Applicant: Kulicke and Soffa Industries, Inc., Fort Washington, PA (US)

(72) Inventors: Jon W. Brunner, Fort Washington, PA (US); Gary W. Schulze, Fort Washington, PA (US); Aashish Shah, Fort Washington, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 556 days.

(21) Appl. No.: 17/844,968

(22) Filed: Jun. 21, 2022

(65) Prior Publication Data

US 2023/0112270 A1   Apr. 13, 2023

Related U.S. Application Data

(60) Provisional application No. 63/254,968, filed on Oct. 12, 2021.

(51) Int. Cl.
*B23K 37/00* (2025.01)
*B23K 20/00* (2006.01)
*B25B 9/02* (2006.01)

(52) U.S. Cl.
CPC ............ *B23K 37/00* (2013.01); *B23K 20/004* (2013.01); *B25B 9/02* (2013.01); *H01L 2224/78308* (2013.01); *Y10T 29/49998* (2015.01)

(58) Field of Classification Search
CPC ... B25B 9/00; B25B 9/02; B23K 20/004–007; B23K 37/00; B23K 11/3072; H01L 24/78; H01L 2224/78308; H01L 2224/7832
See application file for complete search history.

(56) References Cited

U.S. PATENT DOCUMENTS

2013/0221071 A1 *  8/2013  Kim ..................... B23K 20/005
                                                         228/4.5
2020/0020661 A1 *  1/2020  Song .................... B23K 20/004

FOREIGN PATENT DOCUMENTS

| KR | 100895291 B1 | * | 4/2009 | |
| KR | 101758561 B1 | * | 7/2017 | |
| WO | WO-0135896 A1 | * | 5/2001 | ............. A61B 17/30 |

OTHER PUBLICATIONS

Username "oreo", ESEC 3100 Optima Wire Bonder Capillary Change, published Jul. 3, 2020, YouTube, https://www.youtube.com/watch?v=oLL6RquaeSA (Year: 2020).*

* cited by examiner

*Primary Examiner* — Matthew P Travers
(74) *Attorney, Agent, or Firm* — Christopher M. Spletzer, Sr.

(57) ABSTRACT

A method of installing a wire bonding tool on a wire bonding system is provided. The method includes the steps of: (a) holding a wire bonding tool with an installation tool; (b) engaging the wire bonding tool in an aperture of a transducer of a wire bonding system while the wire bonding tool is held by the installation tool; (c) securing the wire bonding tool in the aperture; and (d) releasing the wire bonding tool from the installation tool.

11 Claims, 9 Drawing Sheets

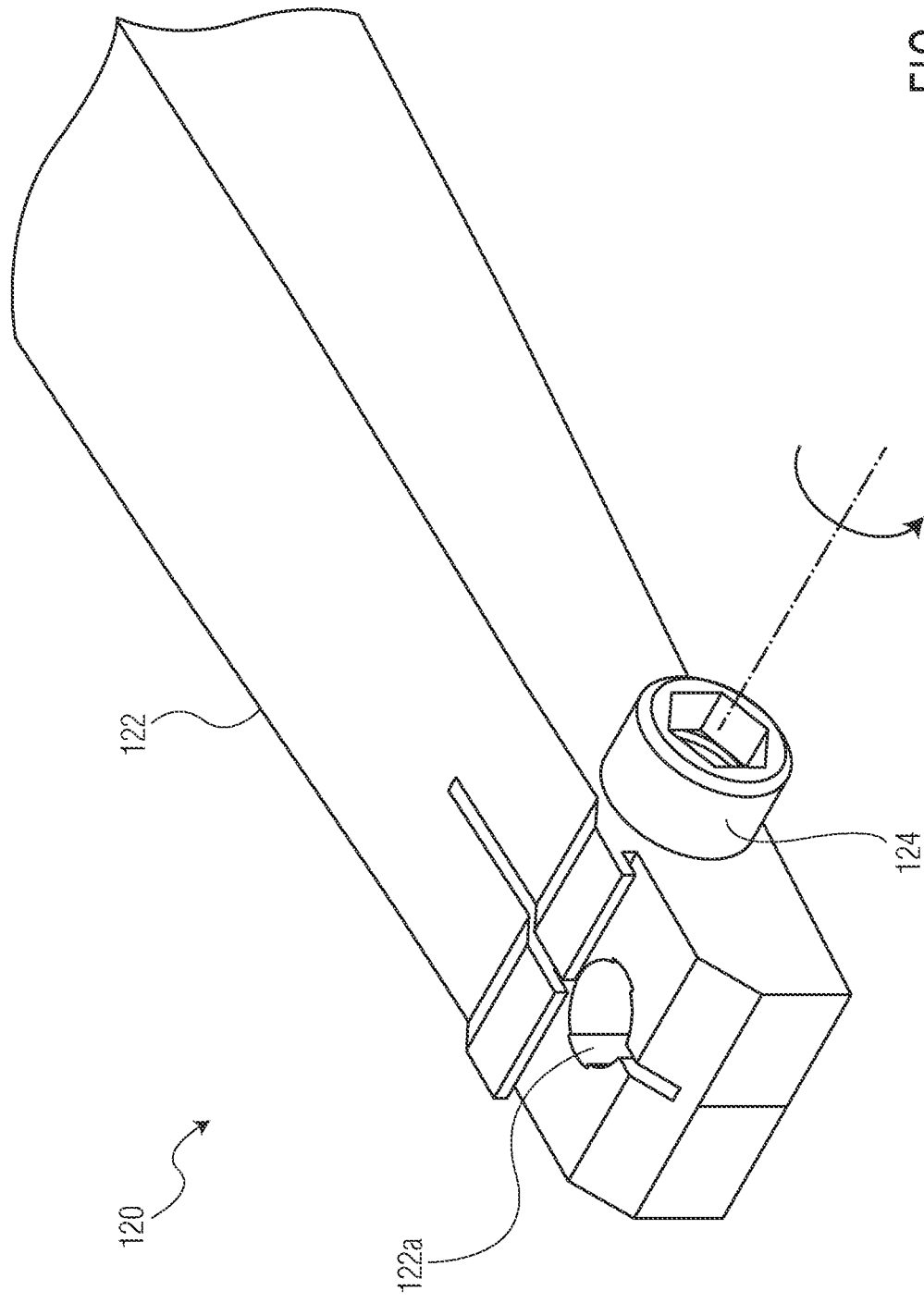

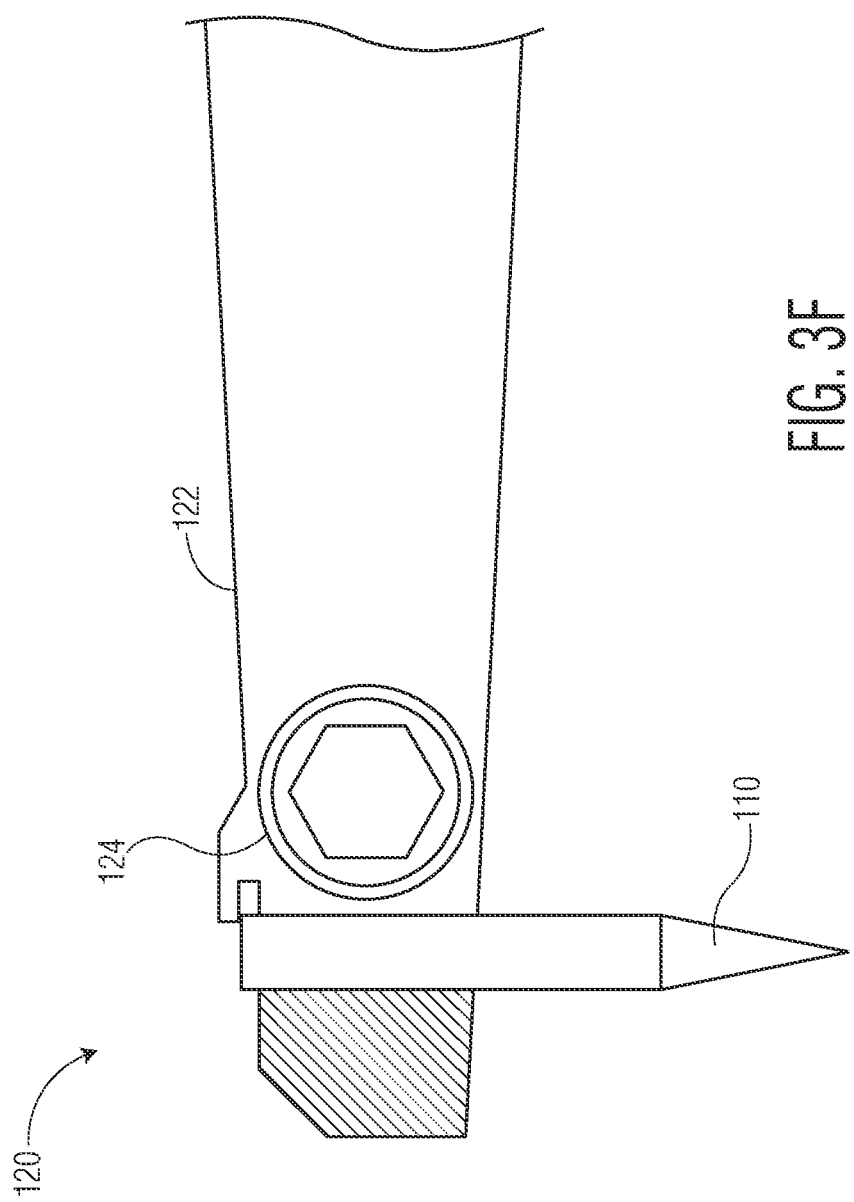

METHODS OF INSTALLING WIRE BONDING TOOLS ON WIRE BONDING SYSTEMS, AND RELATED INSTALLATION TOOLS AND SYSTEMS

CROSS-REFERENCE TO RELATED APPLICATION

This application claims the benefit of U.S. Provisional Application No. 63/254,968, filed Oct. 12, 2021, the content of which is incorporated herein by reference.

FIELD

The invention relates to the installation of wire bonding tools on wire bonding systems, and more particularly, to improved methods of installing wire bonding tools on wire bonding systems, and related installation tools and systems.

BACKGROUND

In connection with automatic wire bonding machines (e.g., wire bonders such as ball bonders), a wire bonding tool (e.g., a capillary) is engaged with a transducer (e.g., an ultrasonic transducer, a thermosonic transducer, etc.). The wire bonding tool is a consumable element of a wire bonding machine. In connection with the installation and replacement of such wire bonding tools, the current practice is that an operator inserts the wire bonding tool into an aperture of the transducer by hand, or using tweezers. Then, a screw is used to secure the wire bonding tool in place.

Such a manual operation results in wire bonding tools being installed in an inconsistent manner, resulting in inconsistent wire bonding operations.

Thus, it would be desirable to provide improved methods of installing wire bonding tools in a wire bonding system.

SUMMARY

According to an exemplary embodiment of the invention, a method of installing a wire bonding tool on a wire bonding system is provided. The method includes the steps of: (a) holding a wire bonding tool with an installation tool; (b) engaging the wire bonding tool in an aperture of a transducer of a wire bonding system while the wire bonding tool is held by the installation tool; (c) securing the wire bonding tool in the aperture; and (d) releasing the wire bonding tool from the installation tool.

According to another exemplary embodiment of the invention, an installation tool for installing a wire bonding tool on a wire bonding system is provided. The installation tool includes a body portion configured to be held by a user of the installation tool. The installation tool also includes a gripping portion configured to hold a wire bonding tool such that the user can engage the wire bonding tool in an aperture of a transducer of a wire bonding system while the wire bonding tool is held by the installation tool.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 3A-3F are a series of block diagram views illustrating installation of a wire bonding tool in a wire bonding system in accordance with an exemplary embodiment of the invention.

DETAILED DESCRIPTION

According to various exemplary embodiments of the invention, installation tools are provided for installation of a wire bonding tool (e.g., a capillary tool) so that the wire bonding tool is placed in a desirable (e.g., optimal or substantially optimal) position in the aperture of the transducer. The gain (i.e., amplitude of tool tip due to ultrasonic vibrations) depends greatly on the position of the wire bonding tool in the transducer aperture. The dimensional tolerance of the transducer aperture tends to become larger over its life cycle due to wear. Ensuring proper installation of wire bonding tools is critical to ensure process portability and robustness. Both finite element (FE) analysis and experimental studies show that installing the wire bonding tool by applying a Y-axis force towards the transducer results in a repeatable "back bias" position (e.g., See FIG. 3C). By installing the wire bonding tool using the installation tool (e.g., where a user releases the installation tool to be "hands-off" at a step during installation, as detailed herein), such a back bias position may be achieved.

Certain installation tools described herein assist in proper installation of wire bonding tools (e.g., in a correct and repeatable position), thereby providing improved bonding performance.

In accordance with various exemplary aspects of the invention, an operator (e.g., a "user") collects (e.g., grabs, grips, obtains, etc.) a wire bonding tool using an installation tool. For example, the operator may collect the wire bonding tool from a wire bonding tool supply. The operator uses the installation tool to insert the wire bonding tool in the aperture of the transducer. The operator then releases the installation tool (leaving the installation tool in place hanging from the transducer via the wire bonding tool), then tightens the screw to the recommended clamping force to complete installation. This results in a more consistent and repeatable wire bonding tool installation—removing much of the guesswork associated with the installation.

Figure 1:
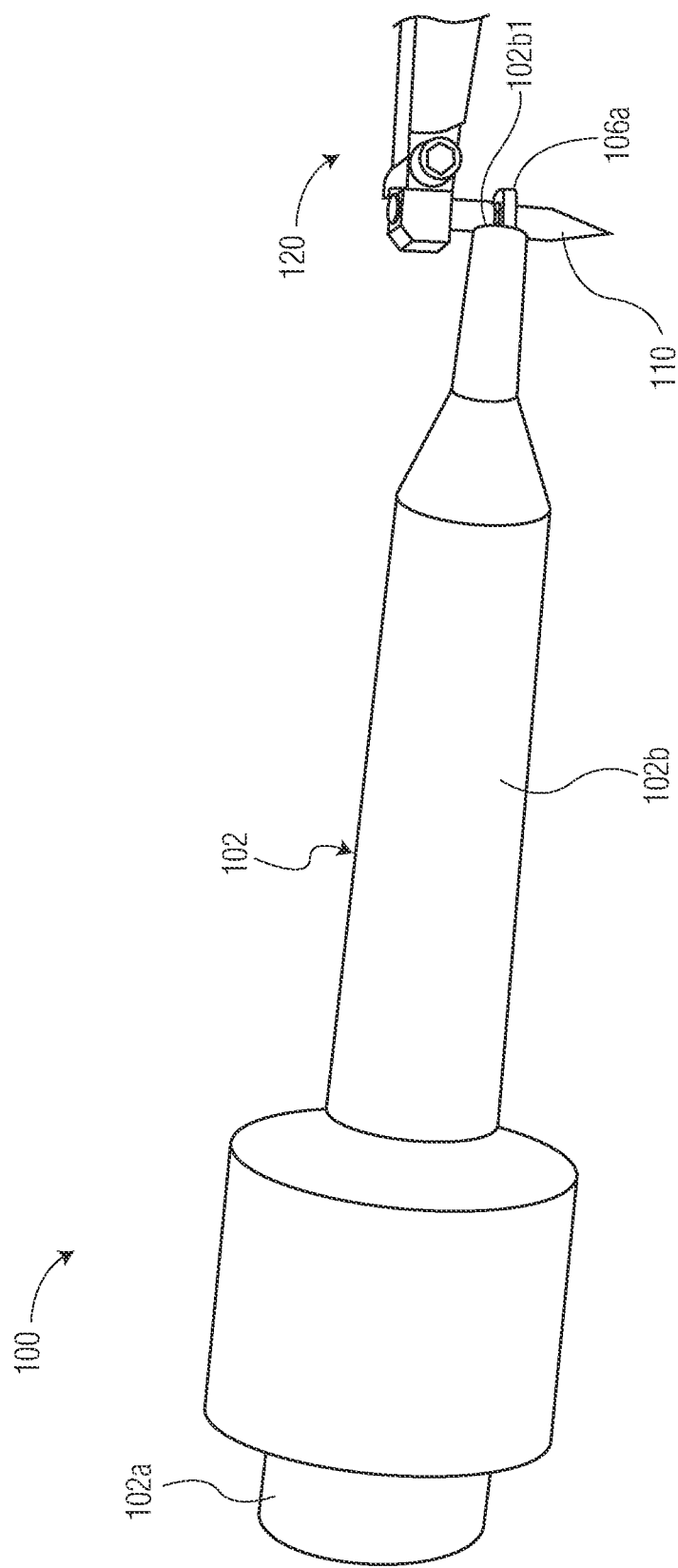
FIG. 1 is a perspective view illustrating an installation tool holding a wire bonding tool while the wire bonding tool is engaged in an aperture of a transducer in accordance with an exemplary embodiment of the invention.

Referring now to FIG. 1, an installation tool 100 (e.g., a spring-based installation tool) is illustrated. Installation tool 100 includes a body portion 102, a gripping portion 106a, and a spring portion 108 (not illustrated in FIG. 1). Body portion 102 includes a fixed portion 102a and a sliding portion 102b that is configured to move with respect to fixed portion 102a. As will be explained in greater detail below, movement of sliding portion 102b with respect to fixed portion 102a operates to hold a wire bonding tool 110 (e.g., see FIG. 1, FIGS. 2C and 3C), and to release the wire bonding tool 110 (e.g., see FIGS. 3E-3F). For example, this movement of sliding portion 102b with respect to fixed portion 102a may operate to compress (e.g., see FIGS. 2B and 3E), and decompress (e.g., see FIG. 2C), spring portion 108 housed within body portion 102. In FIG. 1, installation tool 100 is shown engaging wire bonding tool 110 with a transducer 120 (e.g., a transducer of a wire bonding system).

Figure 2A:
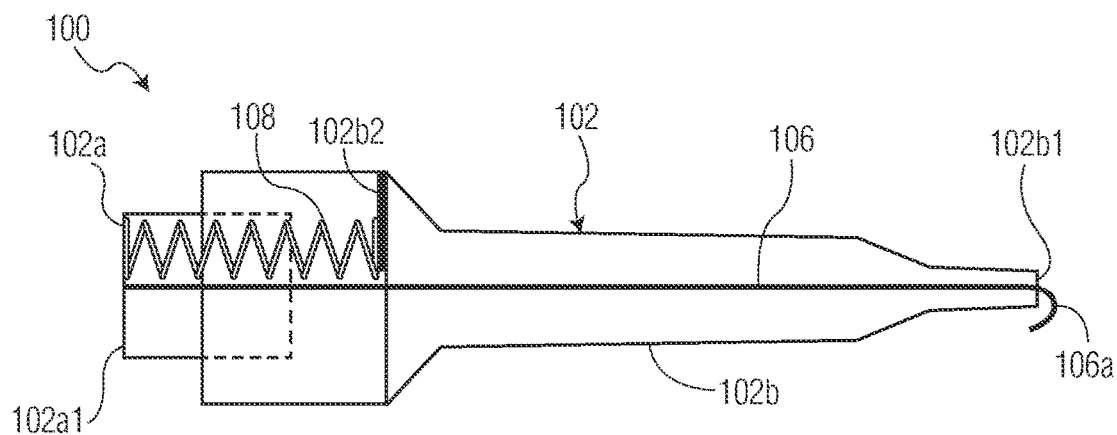
FIGS. 2A-2C are block diagram side sectional views of the installation tool of FIG. 1 in operation in accordance with an exemplary embodiment of the invention.
Figure 2B:
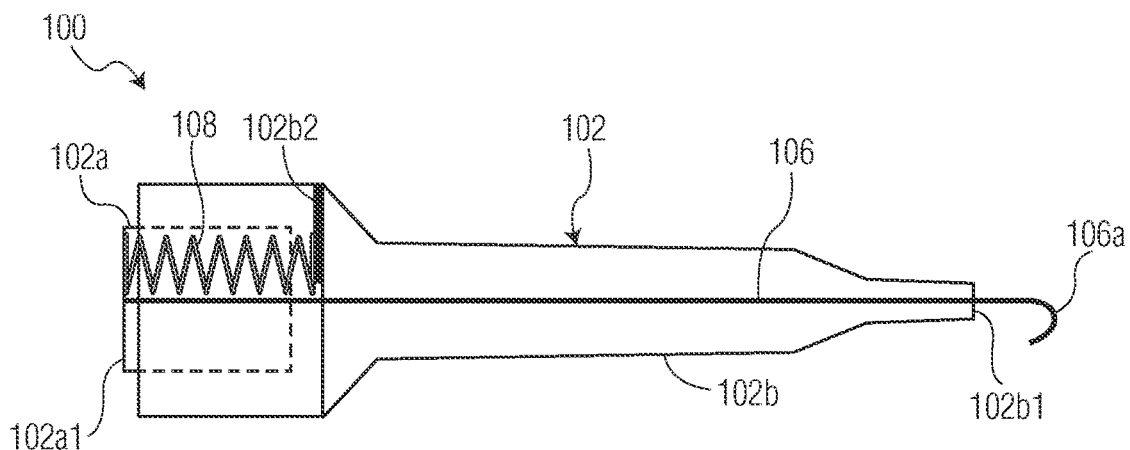
Figure 2C:
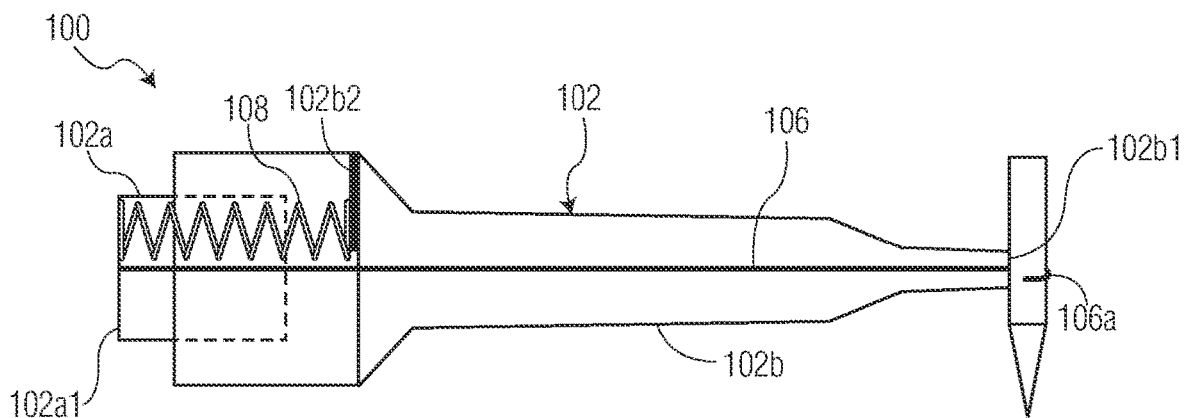

Referring now to FIGS. 2A-2C, a schematic of installation tool 100 is illustrated. Body portion 102 houses spring portion 108 and a coupling portion 106. Coupling portion 106 couples (e.g., attaches) gripping portion 106a (e.g., a hook, a claw, a ring, a hoop, a wedge, a vacuum based tool, a suction tool, a magnetic tool, etc.) to fixed portion 102a (e.g., directly or indirectly). Coupling portion 106 may be unitary with gripping portion 106a, or gripping portion 106a could be removable from coupling portion 106 (e.g., via a threaded connection, friction, locking clip, etc.). Spring portion 108 is illustrated as being connected (directly or indirectly) to fixed portion 102a at a connecting surface 102a1 and connected to sliding portion 102b at a connecting tab 102b2. In FIG. 2A, installation tool 100 is illustrated in an uncompressed state. As such, sliding portion 102b is illustrated extended away from fixed portion 102a. Gripping portion 106a is thus in a position near (e.g., in contact with, or close to) a tip portion 102b1 of sliding portion 102b.

In FIG. 2B, installation tool 100 is illustrated in a compressed state (e.g., while being held by a user, or actuated by an automated process). That is, sliding portion 102b has been moved (to the left as shown in FIG. 2B, for example, by a user/operator) with respect to fixed portion 102a. In this state, tip portion 102b1 of sliding portion 102b is in a position away from gripping portion 106a. In such a position, installation tool 100 is configured such that wire bonding tool 110 may be positioned between gripping portion 106a and tip portion 102b1, prior to gripping. In FIG. 2C, installation tool 100 is illustrated in a partially compressed state. A wire bonding tool 110 is illustrated being gripped (e.g., held) by gripping portion 106a. Wire bonding tool 110 is illustrated in contact with gripping portion 106a and/or tip portion 102b1.

Figure 3B:
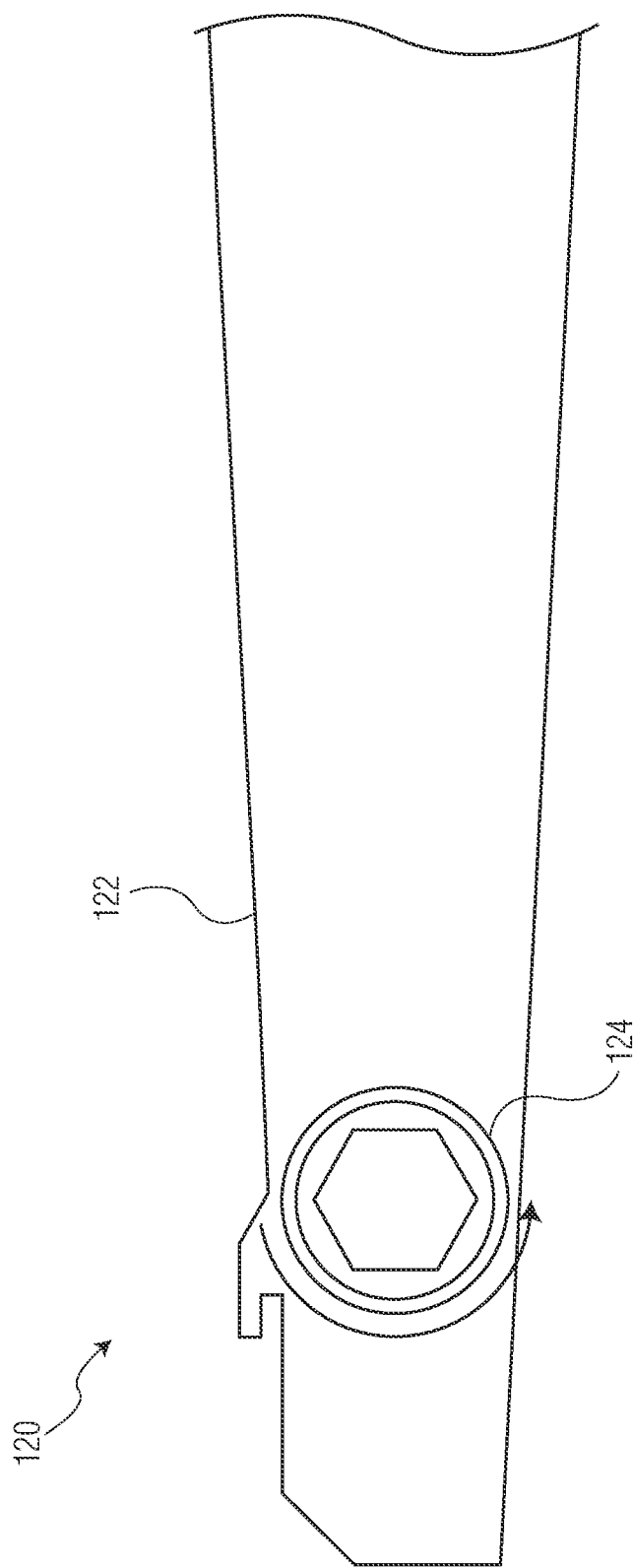
Figure 3C:
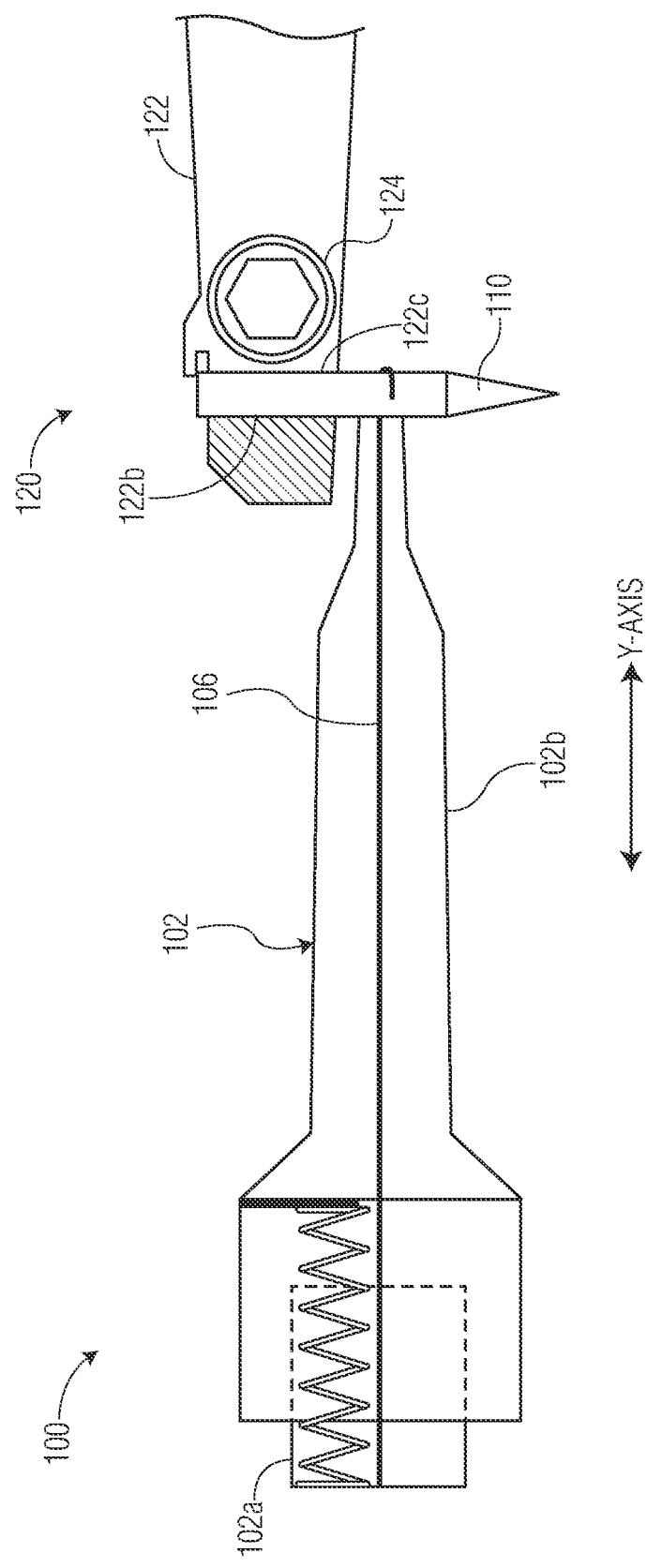
Figure 3D:
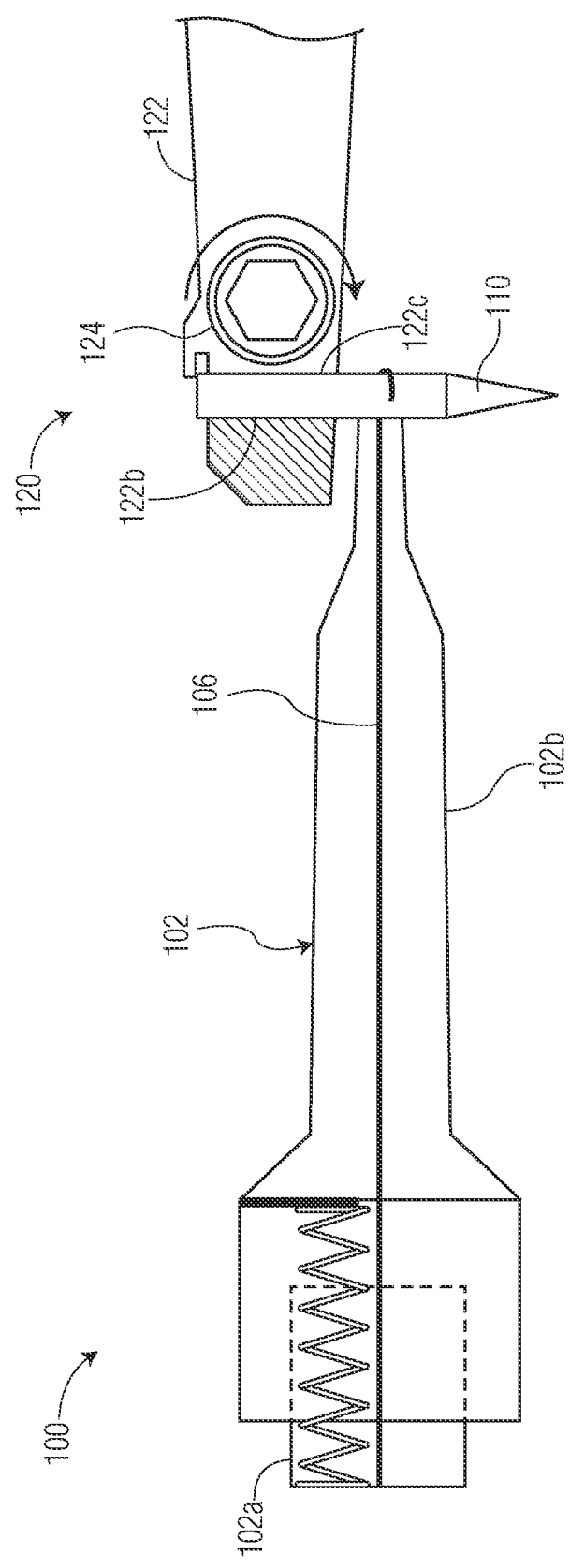
Figure 3E:
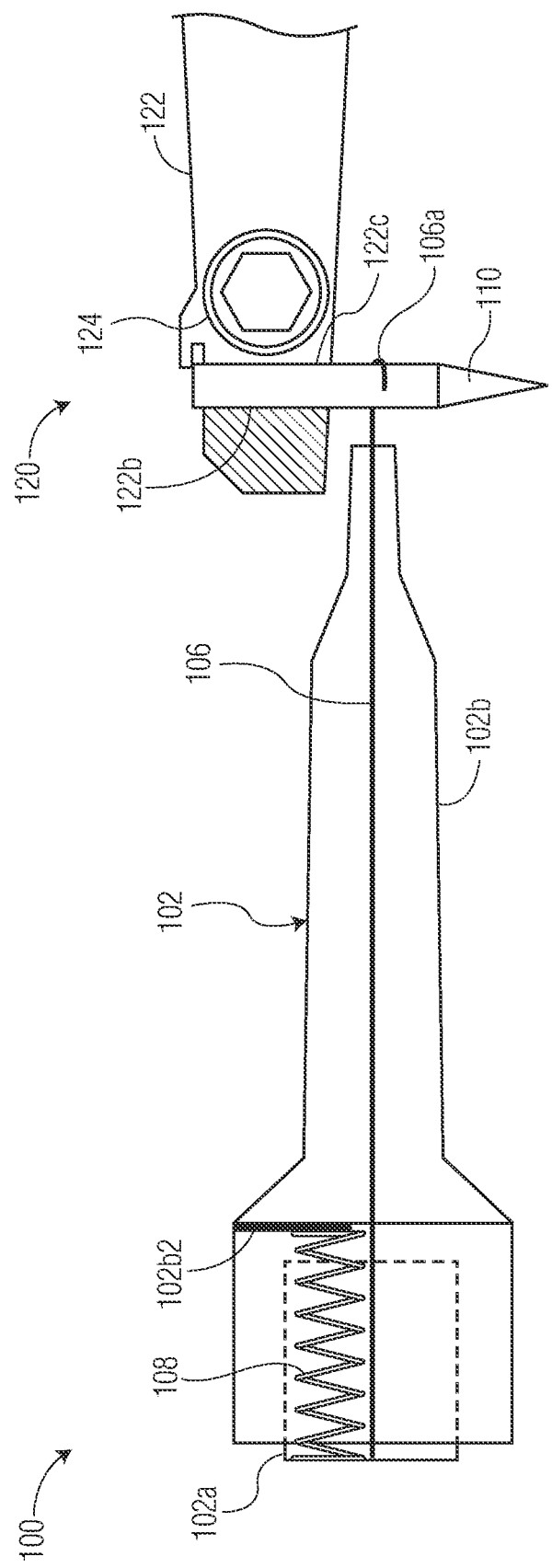

FIGS. 3A-3F illustrate a method of installing a wire bonding tool 110 in a wire bonding system (e.g., in a transducer 120 of a wire bonding system). Referring specifically to FIG. 3A, a perspective view of transducer 120 is illustrated. Transducer 120 includes a transducer body portion 122, which defines an aperture 122a. Transducer 120 includes a tightening mechanism 124 (e.g., a screw, a clip, a wedge, etc.) for tightening the aperture 122a. In FIG. 3B, a side view of transducer 120 is illustrated. Tightening mechanism 124 is illustrated rotating in a loosening direction (e.g., counterclockwise), thus preparing aperture 122a to receive bonding tool 110. In FIG. 3C, installation tool 100 of FIG. 2C is illustrated in a partially compressed state with wire bonding tool 110 held by gripping portion 106a (e.g., where installation tool 100 is held by a user/operator). In FIG. 3C, installation tool 100 has been used (e.g., by an operator, other user, automated process, etc.) to engage wire bonding tool 110 in aperture 122a of transducer 120. At this point, installation tool 100 is released (e.g., by a user, through an automated process, etc.) while installation tool 100 continues to hold wire bonding tool 110 (and while wire bonding tool 110 is engaged in aperture 122a). In this example, wire bonding tool 110 is biased in a predetermined orientation within aperture 122a (e.g., because of the weight of installation tool 100 hanging via wire bonding tool 110) (see bias contact points 122b, 122c marked in FIG. 3C). In FIG. 3D, wire bonding tool 110 is secured in aperture 122a by using tightening mechanism 124 (e.g., a screw, a clip, a wedge, etc.) to tighten bonding tool 110 in aperture 122a of transducer 120. In FIG. 3E, sliding portion 102b has been moved (e.g., by an operator, user, automated process, etc.) with respect to fixed portion 102a (e.g., to the left, as shown in FIG. 3E) such that gripping portion 106a is in a position away from tip portion 102b1 (i.e., gripping portion 106a is no longer holding wire bonding tool 110). In FIG. 3F, installation tool 100 has been moved (e.g., by an operator, user, automated process, etc.) away from transducer 120 such that a wire bonding operation can continue with wire bonding tool 110 now installed.

Figure 4:
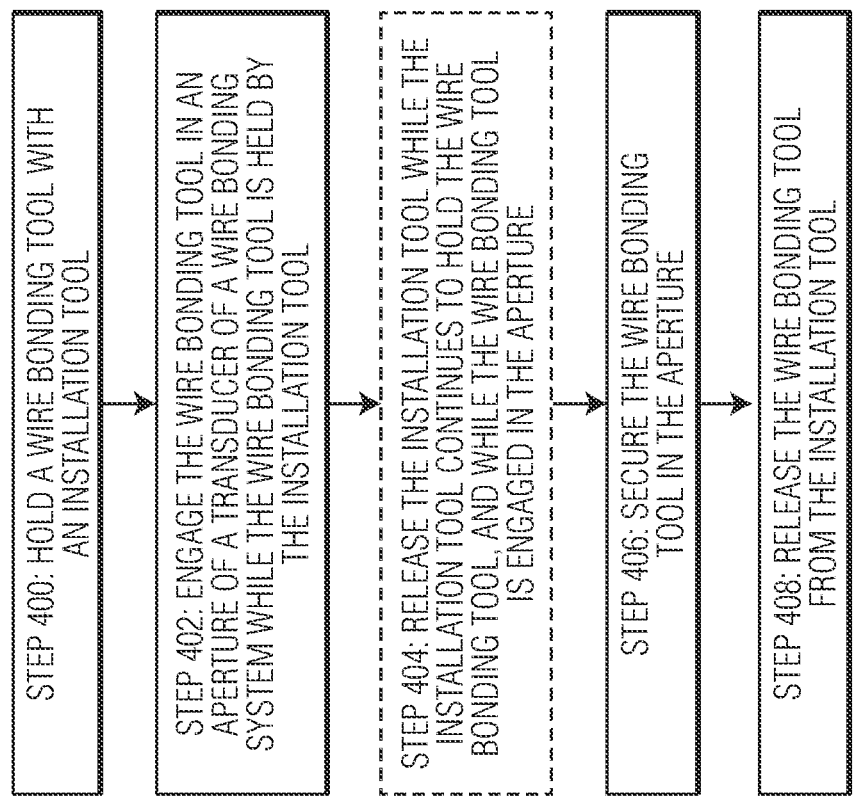
FIG. 4 is a flow diagram illustrating a method of installing a wire bonding tool in a wire bonding system in accordance with various exemplary embodiments of the invention.

FIG. 4 is a flow diagram illustrating an exemplary method of installing a wire bonding tool on a wire bonding system. As will be appreciated by those skilled in the art, certain steps included in the flow diagram may be omitted; certain additional steps may be added; and the order of the steps may be altered from the order illustrated—all within the scope of the invention.

At Step 400, a wire bonding tool is held with an installation tool (e.g., see FIG. 2C or FIG. 3C). At Step 402, the wire bonding tool is engaged in an aperture of a transducer of a wire bonding system while the wire bonding tool is held by the installation tool (See FIG. 3C). This Step 402 is typically accomplished by a user holding the installation tool, but can also be performed by an automated process. At optional Step 404, the installation tool is released (e.g., by a user, operator, an automated process, etc.) while the installation tool continues to hold the wire bonding tool, and while the wire bonding tool is engaged in the aperture. In this context, the "release" of the installation tool may be the operator letting go of the installation tool such that it hangs from the transducer via the wire bonding tool. When the user releases the installation tool, the wire bonding tool is biased in a predetermined orientation within the aperture. At Step 406, the wire bonding tool is secured in the aperture (e.g., see FIG. 3D) (e.g., securing the wire bonding tool in the aperture after the wire bonding tool is in the predetermined orientation, and while the wire bonding tool is held by the installation tool, and using a tightening mechanism of the transducer). At Step 408, the wire bonding tool is released from the installation tool (e.g., see FIGS. 3E-3F, in which the wire bonding tool 110 is released by disengaging the gripping portion 106a from the wire bonding tool 110).

Although the invention has been illustrated and described primarily with respect to the operation of a sliding portion moving relative to a fixed portion, the invention is not limited thereto. As would be understood by those skilled in the art, such a sliding portion and a fixed portion actually move relative to one another. Using the example show in the drawings, sliding portion 102b may be considered to move with respect to fixed portion 102a; however, fixed portion 102a may also be considered to move with respect to sliding portion 102b; and further, both fixed portion 102a and sliding portion 102b may be considered to move with respect to each other. Thus, the naming of a sliding portion and a fixed portion is somewhat arbitrary, and the definition may be met as long as the elements move with respect to one another.

Although the invention has been illustrated and described primarily with respect to a gripping portion including a hook, the invention is not limited thereto. Other types of gripping portions are contemplated (e.g., a claw, a ring, a hoop, a wedge, vacuum based tools, suction tools, magnetic tools, etc.).

Although the invention has been described primarily with respect to an operator manually collecting (e.g., grabbing, gripping, obtaining, etc.) a wire bonding tool with the installation tool, and then the operator engaging the wire bonding tool in an aperture of the transducer, it is not limited thereto. Aspects of the invention relate to an automated process removing operator actions.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of installing a wire bonding tool on a wire bonding system, the method comprising the steps of:
    (a) holding a wire bonding tool with an installation tool while the installation tool is held by a user;
    (b) (i) engaging the wire bonding tool in an aperture of a transducer of a wire bonding system while the wire bonding tool is held by the installation tool and while the installation tool is held by the user, and (ii) releasing the installation tool by the user, while the installation tool continues to hold the wire bonding tool, and while the wire bonding tool is engaged in the aperture;
    (c) securing the wire bonding tool in the aperture; and
    (d) releasing the wire bonding tool from the installation tool.

2. The method of claim 1 wherein the installation tool is a spring-based installation tool.

3. The method of claim 1 wherein after the step of releasing the installation tool the wire bonding tool is biased in a predetermined orientation within the aperture.

4. The method of claim 3 wherein the biasing of the wire bonding tool occurs as a result of the user releasing the installation tool after step (b), while the installation tool continues to hold the wire bonding tool, and while the wire bonding tool is engaged in the aperture.

5. The method of claim 3 wherein step (c) includes securing the wire bonding tool in the aperture after the wire bonding tool is in the predetermined orientation, and while the wire bonding tool is held by the installation tool.

6. The method of claim 1 wherein step (c) includes tightening a tightening mechanism in the transducer to secure the wire bonding tool in the aperture.

7. The method of claim 1 wherein the installation tool includes a gripping portion for holding the wire bonding tool in step (a).

8. The method of claim 7 wherein step (d) includes releasing the wire bonding tool by disengaging the gripping portion from the wire bonding tool.

9. The method of claim 1 wherein the installation tool includes a body portion, the body portion including (i) a fixed portion and (ii) a sliding portion that is configured to move with respect to the fixed portion.

10. The method of claim 9 wherein movement of the sliding portion with respect to the fixed portion operates to hold the wire bonding tool in step (a), and to release the wire bonding tool in step (d).

11. The method of claim 9 wherein movement of the sliding portion with respect to the fixed portion operates to compress, and decompress, a spring portion housed within the body portion.

* * * * *